United States Patent
Jonkman

(10) Patent No.: US 7,030,694 B2
(45) Date of Patent: Apr. 18, 2006

(54) SWITCHED MODE POWER AMPLIFIER

(75) Inventor: Rudi Jonkman, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 66 days.

(21) Appl. No.: 10/495,931

(22) PCT Filed: Nov. 12, 2002

(86) PCT No.: PCT/IB02/04773

§ 371 (c)(1),
(2), (4) Date: May 18, 2004

(87) PCT Pub. No.: WO03/044932

PCT Pub. Date: May 30, 2003

(65) Prior Publication Data

US 2005/0017803 A1    Jan. 27, 2005

(30) Foreign Application Priority Data

Nov. 23, 2001   (EP) .................................. 01204503

(51) Int. Cl.
*H03F 3/217*   (2006.01)
(52) U.S. Cl. ..................................... 330/251
(58) Field of Classification Search ............ 330/207 A, 330/251; 363/17, 41
See application file for complete search history.

(56) References Cited

U.S. PATENT DOCUMENTS

| 4,186,437 A | 1/1980 | Cuk ............................ 363/65 |
| 5,027,264 A * | 6/1991 | DeDoncker et al. .......... 363/16 |

FOREIGN PATENT DOCUMENTS

EP   E00386933   9/1990

* cited by examiner

*Primary Examiner*—Steven J. Mottola

(57) ABSTRACT

A digital switched-mode power amplifier including a dc power source (1) and two dc-to-dc converters arranged in a parallel configuration and arranged to operate in a switched-mode operation is disclosed. Each converter comprises a primary side (2a, 2b) with first switching means and a secondary side (5a, 5b) with second switching means. The primary sides (2a, 2b) are connected to said dc power source (1) and the secondary sides (5a, 5b) are connected to opposite ends of a load (6). Furthermore, each converter is provided with a transformer to obtain dc-isolation between said primary side (2a, 2b) and said secondary side (5a, 5b). The transformer comprises a primary winding (3a, 3b) arranged at the primary side (2a, 2b) and a secondary winding (4a, 4b) arranged on the secondary side (5a, 5b). Moreover, control means (7) comprising primary (10) and secondary control means (12) are arranged to operate the dc-to-dc converters in a complementary manner and to use power control to affect the switching cycle of each converter.

11 Claims, 4 Drawing Sheets

SWITCHED MODE POWER AMPLIFIER

This invention relates to a switched-mode power amplifier circuit for use in audio applications.

In U.S. Pat. No. 4,186,437 a switched mode power amplifier and a dc-to-dc converter is disclosed for use in, for example, audio applications. The switched mode power amplifier includes two switching dc-to-dc converters arranged in a parallel configuration. Each converter is capable of a bi-directional current flow, thereby enabling the power amplifier to operate in a push-pull operation.

In many practical audio applications it is desired to obtain a high security for the equipment used. For example, it is necessary to eliminate dc-voltage peaks that may be transferred through the power amplifier and thereby damage the load. Therefore, it is an incentive to provide audio power amplifiers that offer this security. Since power amplifiers of the type disclosed in U.S. Pat. No. 4,186,437 are not able to meet such a requirement, i.e. prevent such dc-voltage peaks to be transferred to the load, the development has been concentrated on audio amplifiers based on other types of circuits. One such approach is disclosed in EP 386 933. It presents an audio power amplifier comprising two stages connected serially and having insulation barriers comprised of transformers. One control circuit operates the switching process of both the primary side and the secondary side. Thus, transformers for energy transfer are needed both between the driver for the first side switching means and the switching means themselves and between the driver for the secondary side switching means and the switching means themselves in order to obtain a total isolation between the primary side and the secondary side. Furthermore, the secondary side includes two parallel circuits, one for each secondary side switching means. Since the switching means must operate bi-directionally, the secondary side switching means, i.e. the circuits, are connected to each other via steering diodes.

A drawback of the amplifier shown in EP 386 933 is the complex circuit design, which follows mainly two facts. First, a single control circuit is used to operate the switching process of the primary side and the secondary side, which entails a complex circuit arrangement at each switching element in order to provide dc-isolation. Secondly, two stages connected in cascade are used, a first stage including the power supply with the insulation and a second stage, for the modulation of the transferred signal. This also results in a reduced power efficiency of the amplifier, because a plurality of circuits element are used and power is processed by two power stages in cascade.

An object of the present invention is to provide a switched mode amplifier with dc-isolation which, in comparison with the prior art, has a compact and simple circuit design and uses a smaller number of components, in particular, a smaller number of switching elements. This, in turn, provides a reduced size and weight of the power amplifier.

It is a further object of the invention to provide an isolated switched-mode amplifier having a high power efficiency.

The present invention is based on the insight of providing two dc-to-dc converters with insulation barriers and to arrange the converters in a parallel arrangement to provide a switched-mode power amplifier with isolation which is capable of a bi-directional current flow.

Advantageously, the switched-mode power amplifier circuit according to the present invention comprises a dc power source, two dc-to-dc converters arranged in a parallel configuration and arranged to operate in a switched-mode operation. Furthermore, control means are arranged to operate the dc-to-dc converters in a complementary manner. Power control is used to affect the switching cycle of each converter. Moreover, each converter of the amplifier comprises a primary side and a secondary side, with the primary sides being connected to the dc power supply and the secondary sides being connected to opposite ends of a load, wherein each converter comprises transformer means for providing dc-isolation between the primary side and the secondary side, the transformer means comprising a primary winding connected to the primary side and a secondary winding connected to the secondary side.

The solution according to the invention provides several advantages as compared with the existing solutions. For example, the dc-isolation obtained by the transformers provides a high security for the load, such as a loudspeaker, without a complex circuit design. On the contrary, the circuit design of the amplifier according to the invention is simple and compact. Consequently, manufacturing costs of the amplifier are low. Furthermore, the amplifier comprises one stage, which improves the power efficiency.

The control means preferably comprises primary side control means and secondary side control means. The secondary side control means is arranged to sense, at the secondary side of a converter, a first secondary side control signal corresponding to a voltage supplied to the load and control the switching cycle of the secondary sides in a complementary manner by utilizing the first secondary side signal and an audio input signal. The primary side control means is arranged to sense a primary side signal at the first winding of each converter, wherein each primary side signal corresponds to a voltage at the secondary winding of each converter, respectively, and to control the switching cycle of the primary sides in a complementary manner by utilizing the primary side signals.

This configuration provides a complete isolation between the primary side and the secondary side of the converter because there is no physical connection between primary side control means and secondary side control means. All signal communication between secondary side control means and primary side control means is transferred by means of induction between the secondary winding and the primary winding. That is, not only the converters are dc-isolated but also the control circuits by this use of induction to transfer signals, i.e. voltages corresponding to signals.

According to preferred embodiments of the invention, the amplifier comprises only four switching elements or switching means. This is advantageous because the circuit or amplifier design is simplified. Additionally, the control of the amplifier, hence the design of the control circuits is also simplified. This entails a compact and power efficient design of the amplifier. Furthermore, a small number of energy storage elements is used in each converter, preferably five energy storage elements are used in each converter. This feature further improves the power efficiency, because all energy storage elements entail power losses.

The polarities of the first winding and the second winding of each transformer are preferably reversed. This simplifies the complementary drive of the switching means of the converters because the induced voltages at the primary winding can be used in the primary control means without being processed by an inverting circuit, in order to provide signals for the primary side control circuit having a polarity that allows the complementary operation of the switching means of the primary side and the switching means of the secondary side of each converter.

Conveniently, MOSFETs are used to implement the switching means of the converters, which provides a simple and cheap circuit design. Additionally, each MOSFET is connected in a grounded source configuration. It is thereby possible to drive the MOSFETs on each side of the converters by the same drive source, but in phase opposition to allow the complementary operation, i.e. the MOSFETs on the primary side are driven by one drive source and the MOSFETs on the secondary side are driven by another. This, in turn, automatically prevents the overlap of the transistor on times. Furthermore, the bi-directional current implementation ensures that the converters always operate in a continuous conduction mode. This also simplifies the design of the amplifier and provides a compact and cheap design.

Further details and aspects of the present invention will become apparent from the following description of preferred embodiments of the invention.

Preferred embodiments of the invention will now be described in greater detail with reference to the accompanying drawings, in which FIG. 1 is a circuit diagram of an amplifier embodying the invention in a basic form;

Figure 1:
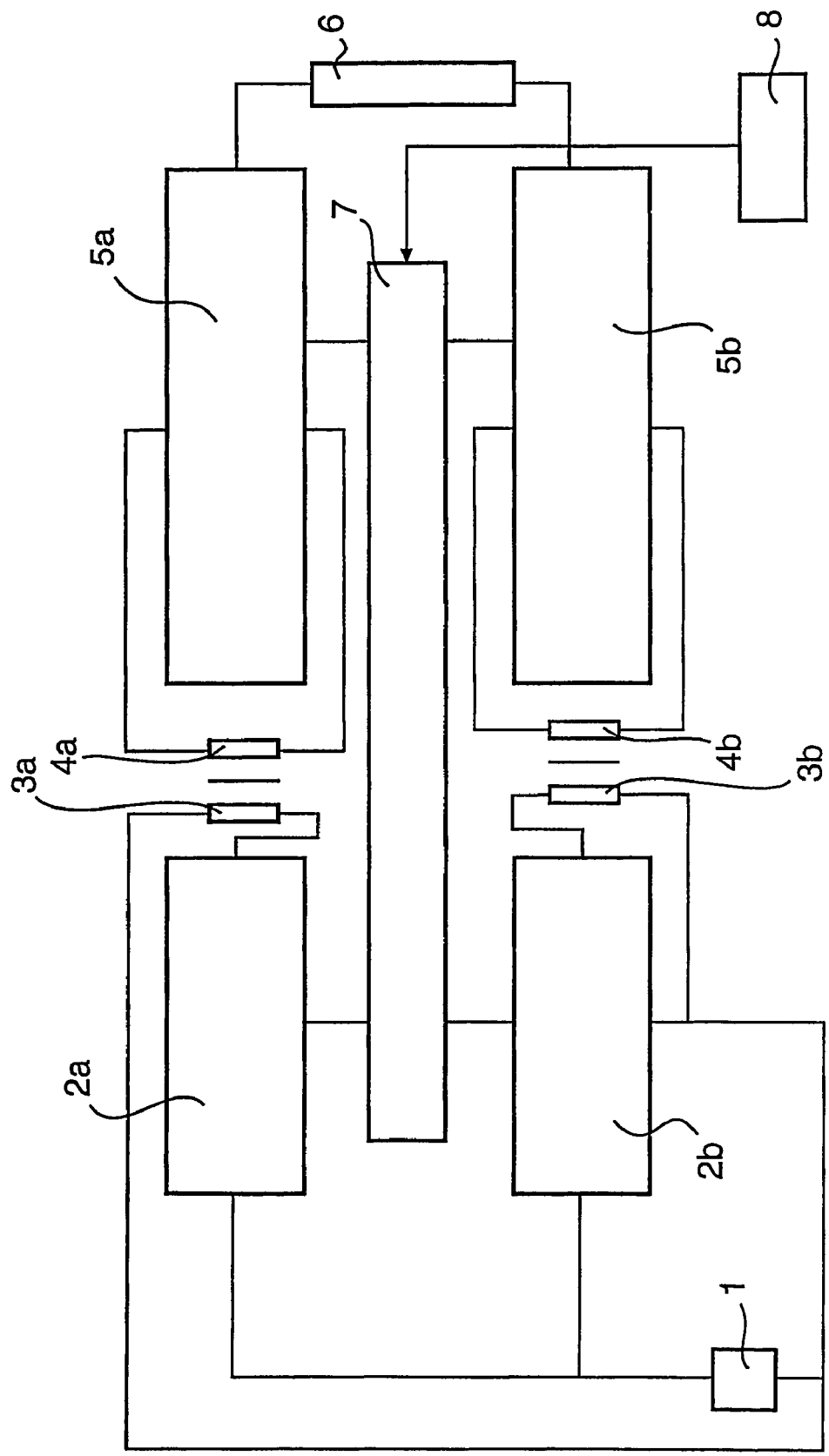

Referring to FIG. 1, a block diagram which is illustrative of certain principles of the invention will be shown. As can be seen, two identical circuits are arranged in a parallel configuration. Each circuit comprises a primary side loop circuit including an input dc voltage source 1, input circuitry means 2a and 2b, a transformer primary winding 3a and 3b, respectively, connected serially in that order. Furthermore, each primary side loop circuitry includes first switching means connected to input energy storage means in a manner that allows an alternating charging and de-charging of the input storage means. Additionally, each circuit comprises a secondary side loop circuit including a transformer secondary winding 4a and 4b, respectively, output circuitry means 5a and 5b, respectively, and a load 6 connected serially and in that order. Furthermore, the output circuitry means includes second switching means connected to output energy storage means in a manner that allows an alternating charging and de-charging of the output storage means.

Figure 4A:
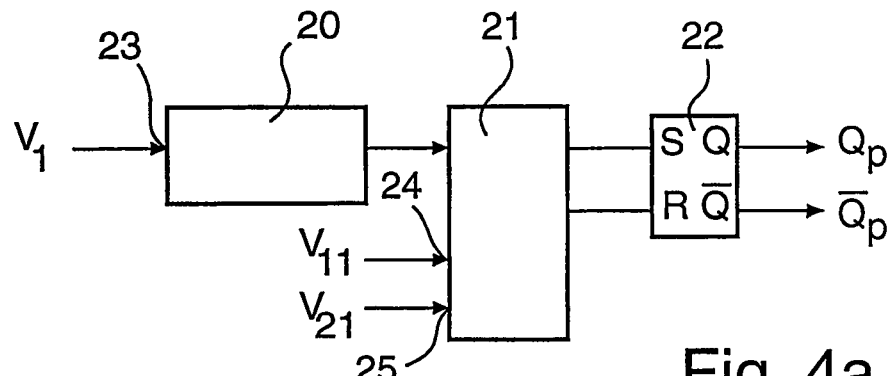

The switching of the first and second switching means of each converter is controlled and synchronized through control circuits 7, whose design and operation will be described in greater detail with reference to FIGS. 2, 4a and 4b. The first switching means of each converter, respectively, alternately causes conduction through the primary winding 3a and 3b, respectively, through the input energy storage component of each converter and then in the reversed direction across the primary winding 3a and 3b, respectively, through the input energy storage components. Consequently, the input energy storage components exhibit two distinct intervals: a de-charging interval and a charging interval. As mentioned above, the switching of the second switching means is also controlled through the control circuits 7 and, similarly, the output energy storage components exhibit two distinct intervals: a de-charging interval and a charging interval.

Furthermore, the control circuit 7 includes an audio input 8 and means for converting the audio signal to a PWM (Pulse Width Modulated) signal. This conversion is effected by means of conventional techniques, for example, a comparator for comparing an audio input signal with, for example, a sawtooth waveform to produce the PWM signal.

The current conducted through the primary windings 3a and 3b will induce a current having a direction in the secondary windings 4a and 4b, respectively, that depends on the polarity relation between the primary windings 3a and 3b and the secondary windings 4a and 4b, respectively. Furthermore, the induced current is alternately coupled by the second switching means of each converter through the load 6. This process will be described in greater detail with reference to FIGS. 2, 3, 4a and 4b.

Figure 2:
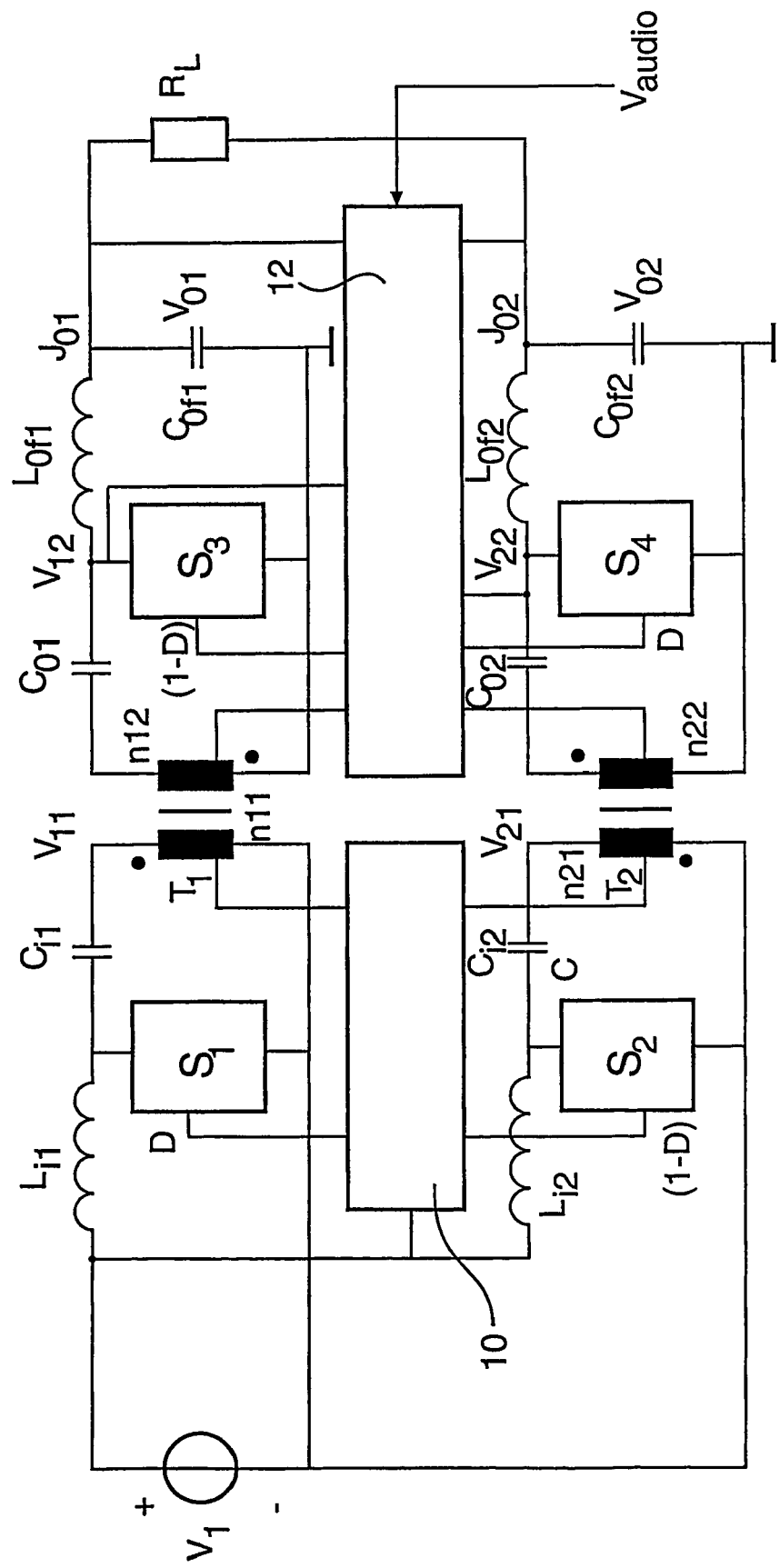
FIG. 2 is a schematic diagram of a first embodiment of an amplifier according to the present invention.

Referring now to FIG. 2, a first embodiment of an amplifier according to the present invention will be shown. The circuit shown comprises two isolated dc-to-dc converters arranged in parallel configuration. A dc power source $V_i$ is applied to the input terminal of the respective converter. On the primary side of each isolated dc-to-dc converter, an input inductance $L_{i1}$ and $L_{i2}$, respectively, is connected to the power source $V_1$. In series with each input inductance $L_{i1}$ and $L_{i2}$, two branches are connected in parallel in each converter. In the first branch of the respective converter, an input storage capacitance $C_{i1}$ and $C_{i2}$ is connected to a first or primary winding n11 and n21 of a transformer $T_1$ and $T_2$, respectively, and a first switching means $S_1$ and $S_2$, respectively, are arranged in a second branch. On the secondary side, the second or secondary winding n12 and n22 of the transformer $T_1$ and $T_2$ is connected in series with an output storage capacitance $C_{o1}$ and $C_{o2}$, respectively. It should be noted that the polarity of the primary and secondary windings has opposite directions as indicated by the dots shown in FIG. 2. Furthermore, the output storage capacitances $C_{o1}$ and $C_{o2}$ are connected at an output junction $J_{o1}$ and $J_{o2}$ to a second switching means $S_3$ and $S_4$, respectively. The output junctions $J_{o1}$ and $J_{o2}$ of the converters are connected via an output filter to opposite ends of a load $R_L$. The output filter shown in FIG. 2 comprises output filter inductances $L_{of1}$ and $L_{of2}$ and output filter capacitances $C_{of1}$ and $C_{of2}$. Each output filter inductance $L_{of1}$ and $L_{of2}$ is connected to the output junctions $J_{o1}$ and $J_{o2}$ and to ground via the output filter capacitances $C_{of1}$ and $C_{of2}$, respectively.

On the primary side of each dc-to-dc converter, three different current loops are defined, resulting from the open and closed modes of the switching means $S_1$ and $S_2$, respectively. Since the converters are identical, only the loops included in the first converter are described. An open mode of the switching means $S_1$ results in an open mode primary side current loop, wherein the power source supplies the loop including the input inductance $L_{i1}$, the input storage capacitance $C_{i1}$ and first winding n11 of the transformer $T_1$. A closed mode of the switching means $S_1$ results in a first closed mode primary side current loop including the input inductance $L_{i1}$ and the switching means $S_1$ supplied by the power source. Furthermore, a second closed mode primary side current loop is defined, which includes the input storage capacitance $C_{i1}$, the first winding n11 of the transformer $T_1$ and the switching means $S_1$.

Three different current loops are also defined on the secondary side of each dc-to-dc converter, resulting from the open and closed modes of the second switching means $S_3$ and $S_4$, respectively. As above, the loops included in one converter are described. In an open mode of second switching means $S_3$ of the first converter, a secondary open mode current loop including the secondary winding n12 of the transformer $T_1$, the output storage capacitance $C_{o1}$ and the output filter is defined. The secondary open mode current loop carries a current induced in the secondary winding n12 of the transformer $T_1$ by a current in the primary winding n11 of the transformer $T_1$. This induced current is, in turn, supplied to the load $R_L$ by the output filter. In a closed mode of the switching means $S_3$, a first closed current loop and a second closed current loop are defined. The first closed mode current loop is defined by the secondary winding n12 of the transformer $T_1$ and the second switching means $S_3$ while the second closed mode current loop is defined by the second switching means $S_3$ and the filter, which, in turn, supplies the load $R_L$.

It should be noted that there are alternative filter designs which can replace the described second order low-pass filter used in the circuit. One conceivable alternative filter design is a fourth-order low-pass filter. This fourth-order low-pass filter is, for example, made of two second-order low-pass filters, as described with reference to FIG. 2, arranged in cascade.

According to the invention, the isolated switching converters are operated in tandem (parallel). The two isolated converters are preferably operated out of phase, that is, with complementary switch drive ratios. In fact, when switching means $S_1$ and $S_4$ are in an open mode for interval $DT_s$, switching means $S_2$ and $S_3$ are in a closed mode for the same interval. That is, the primary side switching means $S_1$ and $S_2$ of the respective converter are operated out of phase, which also applies to the secondary side switching means $S_3$ and $S_4$. Furthermore, the switching means $S_1$ and $S_3$ of the upper converter are operated out of phase, which also applies to the switching means $S_2$ and $S_4$ of the lower converter. D is the switch duty ratio or duty cycle and $f_s=1/T_s$ is the switching frequency. It is desirable to delimit the switching frequency for several reasons. The switching frequency is preferably within the range of 100–350 KHz. Duty ratio is the ratio of the sum of all pulse durations to the total period, during a specific period of continuous operation.

The output voltages $V_{o1}$, $V_{o2}$ across the output filter capacitance in the respective converter are ideally (no parasitic resistances taken into account)

$$V_{o1} = \frac{D}{(1-D)} V_i \quad (1)$$

$$V_{o2} = \frac{(1-D)}{D} V_i \quad (2)$$

where $V_i$ is the input voltage and D is the duty cycle. It should be noted that these equations are valid under the assumption that both converters operate in the continuous conduction mode. As can be seen from these equations, the two output voltages are equal only for D=0.5. Thus, in a switched-mode amplifier including two converters in a parallel arrangement as shown in FIG. 2, the differential output voltage across the load $R_L$, where the output voltages across respective output filter capacitance are indicated by $V_{o1}$ and $V_{o2}$, is given by $$\frac{V_{o1} - V_{o2}}{V_i} = \frac{D}{(1-D)} - \frac{(1-D)}{D}. \quad (3)$$

The duty cycle is preferably limited to $D_{max}=0.7$ $D_{min}=0.3 \quad (4)$ $D=0.5+0.2 \sin \omega t$ where $0.2 \sin \omega t$ is the modulation signal. As can be seen from these equations, it is possible to obtain a sufficient differential output voltage using a limited modulation depth.

The converters are bi-directional, i.e. the current (power) flow in each converter is bi-directional. This is essential because the current through the load, between the two individual converters, is sourcing at one converter output and sinking at the other converter output, resulting in the opposite current flow in the two constituent converters.

Figure 3:
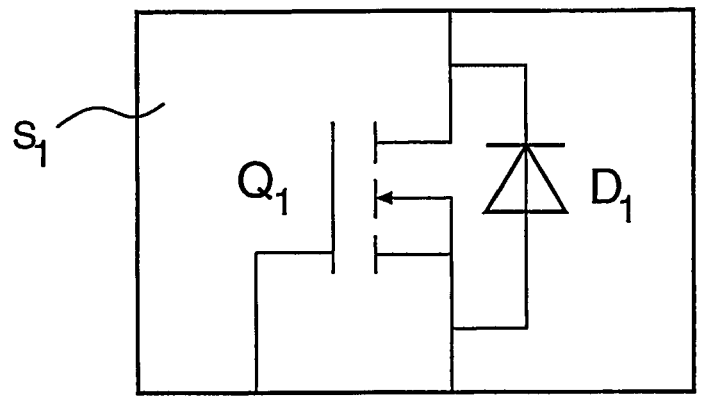
FIG. 3 is a schematic diagram showing a practical implementation of the switching means according to FIG. 2, FIGS. 4a and 4b are schematic diagrams of the primary and secondary side control circuits, respectively.

Each switching means is preferably implemented with n-channel MOSFETs, which is shown in FIG. 3. That is, the first switching means $S_1$ is implemented with $Q_1$ and $D_1$ where $D_1$ is the internal diode or body diode of the MOSFET. The other switching means $S_2$, $S_3$ and $S_4$ are implemented in an identical manner. Of course, it is also conceivable to implement the switching means by using a MOSFET and an external diode. Moreover, there are a number of other semiconductor switches that are conceivable, for example, p-channel MOSFETs and thyristors.

A primary side control circuit 10 and a secondary side control circuit 12 for operating the MOSFETs on the primary side and the secondary side, respectively, are also included. The basic components of the control circuits 10 and 12 will now be described with reference to FIGS. 4a and 4b, respectively. The primary side control circuit 10 is arranged to operate the MOSFETs $Q_1$ and $Q_2$ on the primary side, i.e. the primary side control circuit 10 is connected to the gate of each MOSFET $Q_1$ and $Q_2$. Similarly, the secondary side control circuit 12 is arranged to operate the MOSFETs $Q_3$ and $Q_4$ on the secondary side, i.e. the secondary side control circuit 12 is connected to the gate of each MOSFET $Q_3$ and $Q_4$. As can be seen in FIG. 4a, the primary side control circuit 10 includes a start-up oscillator 20, logic circuitry 21 and a flip-flop 22. The start up oscillator 20 is provided with an input 23 for receiving an initiating signal, and, as indicated, the input is supplied by the dc voltage $V_i$, and produces an oscillating signal for the logic circuitry 21. The logic circuitry 21 is connected to the oscillator 20 and is also provided with signal inputs 24, 25 for receiving control signals corresponding to voltages on the primary sides of the converters. In a preferred embodiment, the inputs 24, 25 are supplied by the voltages $V_{11}$ and $V_{21}$, respectively, in a feedback configuration. As shown in FIG. 2, the voltages $V_{11}$ and $V_{21}$ are produced at the junction between the primary side windings n11 and n21 and the input storage capacitances $C_{i1}$ and $C_{i2}$, respectively. Each voltage $V_{11}$ and $V_{21}$ is affected by induction by a voltage at the secondary windings n12 and n22, respectively. The input signals from the oscillator 21 and the primary side are processed in the logic circuitry 21 to produce a modulated signal to the flip flop 23. Two-phase control of the MOSFETs on the primary side is achieved through a primary side driver (not shown) translating the true ($Q_p$) and complementary ($\overline{Q}_p$) outputs of the flip-flop 23 into control signals, which are then applied to the gates of the MOSFETs on the primary side.

Figure 4B:
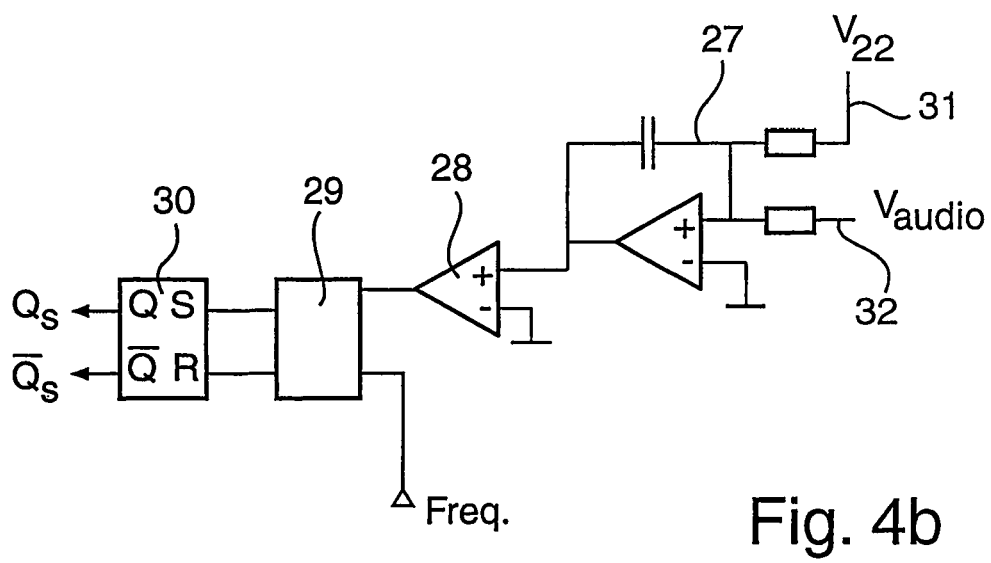

As shown in FIG. 4b, the secondary side control circuit 12 includes an integrator 27, a comparator 28, logic circuitry 29 and a flip-flop 30. A feedback input 31 and an audio input 32 are also provided on the secondary side control circuit 12. The audio signal $V_{audio}$ may be processed in known manner before being applied to the audio input 32, suitable via a feedback operational amplifier (not shown), an anti-aliasing filter (not shown) and an operational amplifier (not shown), with power feedback from the low-pass filter output, indicated by $V_{22}$ in FIGS. 3 and 4b. Of course, it is also possible to use $V_{12}$ as a feedback signal or both $V_{12}$ and $V_{22}$. In a preferred embodiment, the voltage difference between $V_{12}$ and $V_{22}$ is used as a feedback signal. A pulse width-modulated signal is used to switch the flip-flop 30. The pulse width-modulated signal is produced by the logic circuitry using the comparator 28 to compare a control signal from the integrator 27 and a waveform signal, indicated by freq. in FIG. 4b. Two-phase control of the MOSFETs on the secondary side is achieved through a secondary side driver (not shown) translating the true ($Q_s$) and complementary ($\overline{Q}_s$) outputs of the flip-flop 30 into control signals, which are then applied to the gates of the MOSFETs on the secondary side.

It should be noted that there is no physical link connecting the primary side control circuit 10 and the secondary side control circuit 12, such as an optical coupler or pulse transformer. The primary side control circuit 10 is indirectly controlled by the secondary side control circuit 12 via the windings because the varying voltages $V_{11}$ and $V_{21}$, induced by voltages at the secondary windings n12 and n22, respectively, are utilized as control signals for the primary side control circuit 10. The alternating effect of the voltage $V_{11}$ is controlled by the variation of the voltage across the secondary winding n12 of the first converter, which, in turn, is controlled by the MOSFET $Q_3$ on the secondary side and thereby the secondary side control circuit 12. That is, the control signal corresponding to the voltage $V_{11}$ is indirectly fed back from the secondary side via the transformer $T_1$. The same applies to the second converter, i.e. the voltage $V_{21}$.

This feature is advantageous because a complete isolation between the primary side and the secondary side is obtained, not only in dc-to-dc converters but also between the control circuits 10 and 12.

As understood by the skilled person, the logic circuitry of the control circuits is easily implemented in variety of ways and further details thereof are therefore not discussed here.

A convenient feature of the present invention is that all four MOSFETs are referred to ground (grounded source). Therefore, it is possible to drive the MOSFETs on each side of the converters by the same drive source, but in phase opposition as described above, i.e. the MOSFETs on the primary side are driven by one drive source and the MOSFETs on the secondary side are driven by another. The overlap of the transistor on times is thereby automatically prevented. Moreover, the bi-directional current implementation ensures that the converters always operate in a continuous conduction mode.

The MOSFETs $Q_1$, $Q_2$, $Q_3$ and $Q_4$ are alternatively turned on and off by their respective drives. As indicated in FIG. 2, the MOSFET $Q_1$ is turned on for interval $DT_s$ and turned off for interval $(1-D)T_s$, while the inverted condition is valid for the MOSFET $Q_3$. The MOSFET $Q_2$ is turned on for interval $(1-D)T_s$ and turned off for interval $DT_s$, while the inverted condition is valid for the MOSFET $Q_4$. The internal diodes of the MOSFETs conduct during periods when the MOSFET is OFF, and when a control signal opens the MOSFET, i.e. the MOSFET is ON, the MOSFET takes over from the internal diode in order to eliminate forward losses in the internal diode.

In operation, the circuit works as follows. For purposes of clarity, the operation will be described with reference to one converter. It should be noted that a second converter of the circuit operates in a similar way. In a first interval, when the MOSFET $Q_1$ is OFF and the MOSFET $Q_3$ is ON, i.e. is in a conducting mode, the input current provided by the dc power supply $V_i$ charges the input inductance $L_{i1}$ and input capacitance $C_{i1}$ and flows through the primary winding n11 of the transformer $T_1$. An induced current flowing in the same direction, due to the reversed polarity of the windings n11, n12, as the input current and caused by the reflection of the input current in the secondary winding n12 of the transformer T1 charges the output capacitance $C_{o1}$. The intensity of the induced current can be adjusted, for example, by changing the transformer turn ratio, i.e. the ratio between the number of turns of the primary winding of the transformer and the number of turns of the secondary winding of the transformer. A preferred transformer turn ratio is 16:1.

The output inductance $L_{of1}$ discharges into the load $R_L$ and the output filter capacitance $C_{of1}$, which causes an output voltage $V_{o1}$, across the output filter capacitance $C_{of1}$. As shown in equations (1) and (2), the output voltages $V_{o1}$, $V_{o2}$ are functions of the duty cycle D and the input voltage $V_i$. During this first interval, the internal diode $D_3$ of the MOSFET $Q_3$ switch carries the sum of input and output currents or, in other words, the induced current and the discharge current from the output inductance $L_{of1}$. During this first interval, electrical energy is stored in the input capacitance $C_{i1}$ and the output capacitance $C_{o1}$ and magnetic energy is released from the input inductance $L_{i1}$, and the output inductance $L_{of1}$.

In a second interval, when the MOSFET $Q_1$ is turned ON, i.e. is in a conducting mode, and the MOSFET $Q_3$ is turned OFF, the input current charges the input inductance $L_{i1}$ and the input capacitance $C_{i1}$ discharges into the MOSFET $Q_1$ and the primary winding n11 of the transformer $T_1$. This discharge current is induced in the secondary winding n12 of the transformer $T_1$, which, in turn, discharges the output capacitance $C_{o1}$ and charges the output filter inductance $L_{of1}$ and supplies the load $R_L$. As in the first interval, the load $R_L$ is supplied with the voltage $V_{o1}$. In this second interval, the MOSFET $Q_1$ carries the sum of the input and output currents. The lengths of these intervals are easily adjusted by variation of the duty cycle D and the switching frequency $f_s$.

As mentioned above, the second converter of the circuit is operated in a similar, but reversed, manner, i.e. when $Q_1$ is turned ON, $Q_2$ is turned OFF and the reversed relation applies for $Q_3$ and $Q_4$. That is, the two converters are operated out of phase. The total voltage across the load will thereby be the differential voltage as shown in equation (3). It should be noted that it is also conceivable to operate the MOSFETs in an interleaved mode, that is, the periods of the MOSFETs are not completely out of phase.

The reversed polarities of the windings of the first transformer $T_1$, namely n11 and n12, and the second transformer $T_2$, namely n21 and n22, ensures that the voltage across n11 has the same direction as the voltage across n22 during the switching intervals. This relation also applies for n12 and n21, but in a reversed direction as compared to the voltage across n11 and n22.

It should be noted that it is conceivable to utilize other circuit configurations to obtain the desired polarity relation between the voltage at the secondary winding n12 and n22, respectively, and the signal corresponding to a voltage on the primary side supplied to the primary side control circuit. For example, if the windings n11 and n12 have the same polarity, a signal inverter stage could be included in the primary side control circuit 10. This means that, before being supplied to the logic circuitry 21, the input signals $V_{11}$ and $V_{21}$, are, inverted by an inverter stage (not shown) to produce the signals that enables the flip-flop 22 to produce the output signals, i.e. the true ($Q_p$) and complementary ($\overline{Q}_p$) outputs, for the drive that is required to enable it to control the MOSFETs on the primary side in the complementary manner as described above.

An opposite polarity of the output currents from the converters occurs when the input current has a reversed polarity, i.e. the current supplied from the power source. Therefore, the switches have to permit a bi-directional flow of current and power, which is accomplished by the MOSFETs and their internal diodes shown in FIG. 3.

Figure 5:
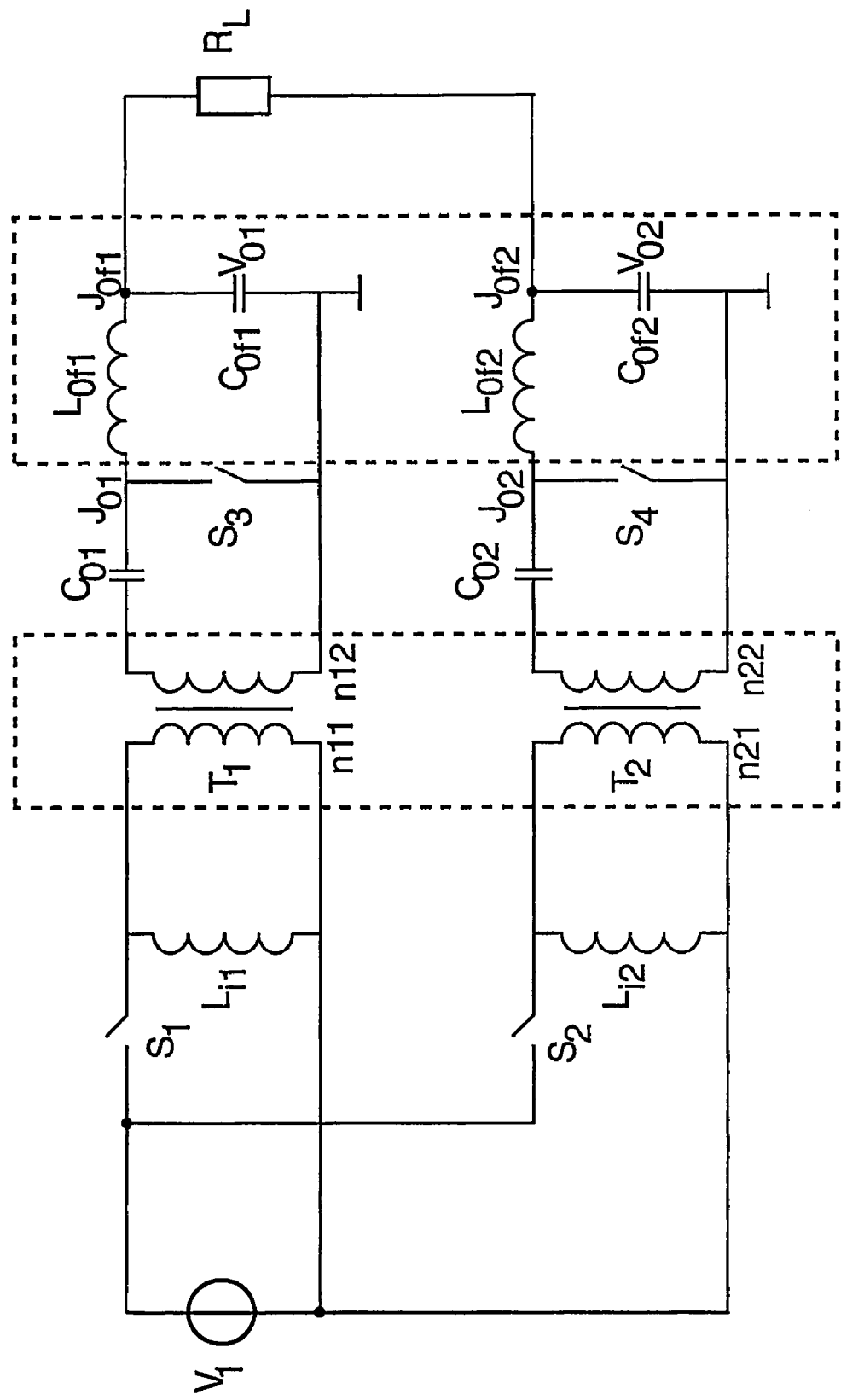
FIG. 5 is a schematic diagram of a second embodiment of the basic circuitry of an amplifier according to the present invention.

Referring now to FIG. 5, the schematic diagram shows a second embodiment of the circuitry of an amplifier according to the present invention. The same reference numerals for the components included in the converter circuits are used here as in the first embodiment of the converter circuits shown in FIG. 2.

Similarly as the circuitry described with reference to FIG. 2, the circuitry shown comprises two isolated dc-to-dc converters arranged in a parallel configuration. A dc power source $V_i$ is applied to the input of the respective converter. On the primary side of each dc-to-dc converter, a first switching means $S_1$ and $S_2$, respectively, is connected to the dc power source $V_i$. In series with each first switching means $S_1$ and $S_2$, a parallel arrangement is included in the respective converter. The parallel arrangements comprises, in a first branch, a primary winding n11 and n21 of a transformer $T_1$ and $T_2$, respectively, and, in a second branch, an input energy storage means $L_{i1}$ and $L_{i2}$, respectively. The dotted square surrounding the transformers indicates the insulation barrier.

The secondary side of the circuit shown in FIG. 5 is similar to the secondary side of the circuit described with reference to FIG. 2. Furthermore, the output filter of the second embodiment, indicated by a dotted square surrounding the components included in the filter is similar to the output filter described with reference to FIG. 2.

The hardware implementation of this switching scheme is, for example, accomplished in a similar manner as described with reference to FIG. 3. That is, each switching means $S_1$, $S_2$, $S_3$ and $S_4$ is realized by a semi-conductor switch, preferably, n-channel MOSFETs and its internal diode, as shown in FIG. 3. The control circuits 10, 12 disclosed in FIGS. 4a and 4b are also suitable, after appropriate modifications, for controlling an amplifier comprising two dc-to-dc converters according to FIG. 5. These modifications of the control circuits 10, 12 are easily performed by the skilled person and are therefore not described.

The two different dc-to-dc converter types, see FIGS. 2 and 5, used to implement the isolated switched-mode amplifier according to the present invention should be considered only as examples. It is possible to realize the amplifier by using a number of different dc-to-dc converters, for example, a fly-back converter, buck-boost type converter or a Sepic converter without departing from the scope of the invention as defined in the claims.

One particular application envisaged for a device in accordance with the invention is its use in an audio amplifier stage, for example in an audio-micro set or in a DVD-receiver with 5.1 Dolby Digital audio channels. Another application is its use in a sub-woofer stage for use in music applications.

In summary, a switched-mode power amplifier including a dc power source and two dc-to-dc converters arranged in a parallel configuration and arranged to operate in a switched-mode operation is disclosed. Each converter comprises a primary side with first switching means and a secondary side with second switching means. The primary sides are connected to said dc power source and the secondary sides are connected to opposite ends of a load. Furthermore, each converter is provided with a transformer to obtain dc-isolation between said primary side and said secondary side. The transformer comprises a primary winding arranged on the primary side and a secondary winding arranged on the secondary side. Moreover, the amplifier comprises control means, including primary and secondary control means, arranged to operate the dc-to-dc converters in a complementary manner and to use power control to affect the switching cycle of each converter.

The invention claimed is:

1. A switched-mode power amplifier circuit comprising a dc power source,
   two dc-to-dc converters arranged in a parallel configuration and arranged to operate in a switched-mode operation,
   control means arranged to operate said dc-to-dc converters in a complementary manner and to utilize power control to affect the switching cycle of each converter,
   wherein each converter comprises a primary side and a secondary side with said primary sides being connected to said dc power supply and said secondary sides being connected to opposite ends of a load, wherein each converter comprises transformer means for providing dc-isolation between said primary side and said secondary side, said transformer means comprising a primary winding connected to said primary side and a secondary winding connected to said secondary side.

2. The switched-mode power amplifier circuit of claim 1, wherein said control means comprises primary side control means and secondary side control means, wherein said secondary side control means is arranged to
   sense, on said secondary side of a converter, a first secondary side control signal corresponding to a voltage supplied to said load, and arranged to
   control the switching cycle of the secondary sides in a complementary manner by utilizing said first secondary side signal and an audio input signal, and
   wherein said primary side control means is arranged to
   sense a primary side signal at the primary winding of each converter, wherein each primary side signal corresponds to a voltage at the secondary winding of each converter, respectively, and arranged to
   control the switching cycle of the primary sides in a complementary manner by utilizing said primary side signals.

3. The switched-mode power amplifier circuit of claim 1, wherein said secondary side control means is connected to said secondary side of each converter, respectively, and said primary control means is connected to said primary side of each converter, wherein said secondary side control means comprises
   means for receiving said audio input signal,
   means for sensing said secondary signal corresponding to a voltage supplied to said load,
   comparison means for providing a comparison signal by comparing said audio signal with said secondary side signal,
   logic means for providing a first set of complementary signals by utilizing said comparison signal and an oscillating input signal,
   a control circuit for operating the switching of the secondary sides of converters in a complementary manner by utilizing said first set of complementary signals,
   wherein said primary side control means comprises
   means for sensing, on each primary side, said primary side signal corresponding to a first voltage at the primary winding, induced by a second voltage at the secondary winding, wherein said second voltage is caused by the switching of the secondary side, logic means for providing a second set of complementary signals by utilizing said primary side signals, and a control circuit for operating the switching primary sides of the converters in a complementary manner by utilizing said second set of complementary signals.

4. The switched-mode power amplifier circuit of claim 1, wherein said primary side of each converter comprises first switching means, input energy storage means connected to said first switching means, to said primary winding, and to said power supply, and wherein said first switching means is connected to said power source, to said primary winding and to said input energy storage means, thereby defining a first current loop during an open mode of said first switching means and at least one second current loop during a closed mode of said first switching means, and wherein said secondary side of each converter comprises second switching means, output energy storage means connected to said second switching means and to said secondary winding, and output filter means connected to said second switching means, to said output energy storage means and to said load, wherein said second switching means is connected to said output filter means, to said secondary winding and to said output energy storage means, thereby defining a first current loop during an open mode of said second switching means and a second and a third current loop during a closed mode of said second switching means, and wherein said primary control means is connected to and arranged to control the switching of said first switching means of each converter, whereby coupling and de-coupling of said current loops of the primary sides is controlled, and wherein said secondary side control means is connected to and arranged to control the switching of said second switching means of each converter, whereby coupling and de-coupling of said current loops of the secondary sides is controlled.

5. The switched-mode power amplifier circuit of claim 1, wherein the polarities of said primary winding and said secondary winding of each transformer are reversed.

6. The switched-mode power amplifier circuit of claim 4, wherein the input energy storage means of each converter comprises an input inductance connected to said power supply and to said first switching means, and an input capacitance connected to a junction between said input inductance and said first switching means and to a first connection of said primary winding, wherein a second connection of said primary winding is connected to a junction between said first switching means and to said power supply, wherein said output energy storage means of each converter comprises an output storage capacitance connected to said second switching means and to a first connection of said secondary winding, wherein the output filter means of each converter comprises an output filter inductance connected to a junction between said output storage capacitance and said second switching means and to a first connection of said load, and an output filter capacitance connected to a junction between said output filter inductance and said first connection of said load and to a junction between said second switching means, a second connection of said secondary winding and a second connection of said load, wherein said primary side input voltage of each converter is supplied to said primary side control means from a junction between said input capacitance and said first connection of said primary winding, and wherein said secondary side input voltage is supplied to said secondary side control means from the junction between said output capacitance, said second switching means and said output filter inductance of either one of the converters.

7. The switched-mode power amplifier circuit of claim 4, wherein the input energy storage means of each converter comprises an input inductance connected to a junction between said first switching means and a first connection of said primary winding and to said power supply, wherein a second connection of said primary winding is connected to a junction between said power supply and said input inductance, wherein said output energy storage means of each converter comprises an output storage capacitance connected to said second switching means and to a first connection of said secondary winding, wherein the output filter means of each converter comprises an output filter inductance connected to a junction between said output storage capacitance and said second switching means and to a first connection of said load, and an output filter capacitance connected to a junction between said output filter inductance and said first connection of said load and to a junction between said second switching means, a second connection of said secondary winding and a second connection of said load, wherein said primary side input voltage of each converter is supplied to said primary side control means from a junction between said first switching means said first connection of said primary winding and said input inductance, wherein said secondary side input voltage is supplied to said secondary side control means from the junction between said output capacitance, said second switching means and said output filter inductance of either one of the converters.

8. The switched mode power amplifier circuit of claim 2, wherein said control circuit of said primary side control means includes means for varying the switching, by utilizing said second set of complementary signals of said first switching means of the converters in a complementary manner in order to control the switch duty ratio for one state of said first switching means of a first converter and the complementary duty ratio for the other state of said first switching means of a second converter, and wherein said control circuit of said secondary side control means includes means for varying the periodic operation, by utilizing said first set of complementary signals, of said second switching means in a complementary manner in order to control the complementary duty ratio for one state of said second switching means of a first converter and the duty ratio for the other state of said second switching means of a second converter.

9. The switched-mode power amplifier circuit of claim 6, wherein each switching means comprises a MOSFET wherein each MOSFET is connected in a grounded source configuration, whereby the drive of the MOSFETs on the primary side is from a primary driver comprised in said control circuit of said primary side control means, wherein said primary driver includes translating means for translating a true binary signal and a complementary binary signal to control signals for the primary side MOSFETs, said true binary signal and said complementary binary signal being produced by a primary side flip-flop by utilizing said second set of complementary signals, wherein said primary side flip-flop is comprised in said control circuit of said primary side control means, and the drive for the MOSFETs on the secondary side is from a secondary driver comprised in said control circuit of said secondary side control means, wherein said secondary driver includes translating means for translating a true binary signal and a complementary binary signal to control signals for the secondary side MOSFETs, said true binary signal and said complementary binary signal being produced by a secondary side flip-flop by utilizing said first set of complementary signals, wherein said secondary side flip-flop is comprised in said control circuit of said secondary side control means.

10. Use of two dc-to-dc converters arranged in a parallel configuration and arranged to operate in a switched-mode operation, each having a primary side and a secondary side separated by transformer means comprising a primary winding connected to said primary side and a secondary winding connected to said secondary side in a switched-mode audio power amplifier, wherein said converters are operated in a complementary manner at variable switching cycles using an audio input signal and a reference signal corresponding to the voltage supplied to a load.

11. A method of controlling a switched-mode power amplifier comprising two dc-to-dc converters arranged in a parallel configuration, wherein each converter comprises a primary side being connected to a power supply and a secondary side being connected to a load and a transformer, having a primary winding and a secondary winding, for providing dc-isolation between said primary side and said secondary side, the method comprising the steps of sensing a secondary side signal, on a secondary side of at least one converter, wherein said secondary side signal corresponds to a voltage being supplied to said load, receiving an audio input signal, utilizing said secondary side signal and said input signal to control the switching cycle of the secondary sides of the converters in a complementary manner, sensing a primary side signal, on each primary side, wherein each primary side signal corresponds to the voltage on the secondary winding of a transformer, utilizing said primary side signals to control the switching cycle of the primary sides in a complementary manner.

* * * * *